United States Patent
Hsu (10) Patent No.: US 9,099,364 B1
(45) Date of Patent: Aug. 4, 2015

(54) MPS-C2 SEMICONDUCTOR DEVICE HAVING SHORTER SUPPORTING POSTS

(71) Applicant: POWERTECH TECHNOLOGY INC., Hsinchu (TW)

(72) Inventor: Shou-Chian Hsu, Hsinchu (TW)

(73) Assignee: POWERTECH TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/460,876

(22) Filed: Aug. 15, 2014

(51) Int. Cl.
*H01L 23/48* (2006.01)
*H01L 23/52* (2006.01)
*H01L 29/40* (2006.01)
*H01L 23/00* (2006.01)
*H01L 23/31* (2006.01)

(52) U.S. Cl.
CPC ............ *H01L 24/14* (2013.01); *H01L 23/3157* (2013.01); *H01L 24/06* (2013.01); *H01L 2224/0401* (2013.01); *H01L 2224/06102* (2013.01); *H01L 2224/1403* (2013.01); *H01L 2224/1412* (2013.01); *H01L 2224/14517* (2013.01)

(58) Field of Classification Search
CPC ............................................ H01L 2224/06102
See application file for complete search history.

(56) References Cited

U.S. PATENT DOCUMENTS

| | | | |
|---|---|---|---|
| 2002/0063340 A1* | 5/2002 | Sahara et al. | 257/773 |
| 2003/0141591 A1 | 7/2003 | Hsu et al. | |
| 2005/0133937 A1* | 6/2005 | Ito | 257/786 |
| 2010/0013094 A1* | 1/2010 | Jo et al. | 257/738 |
| 2011/0283034 A1* | 11/2011 | Kang et al. | 710/305 |
| 2012/0129333 A1* | 5/2012 | Yim et al. | 438/613 |
| 2013/0256876 A1* | 10/2013 | Lee et al. | 257/737 |
| 2014/0124914 A1* | 5/2014 | Lin et al. | 257/712 |
| 2014/0167254 A1* | 6/2014 | Yu et al. | 257/737 |

* cited by examiner

*Primary Examiner* — Angel Roman
(74) *Attorney, Agent, or Firm* — Muncy, Geissler, Olds & Lowe, P.C.

(57) ABSTRACT

Disclosed is a MPS-C2 (Metal Post Soldering Chip Connection) semiconductor device having shorter supporting posts. Bonding pads are reentrant from a wafer-level packaging (WLP) layer formed on the active surface. A patterned UBM metal layer includes a plurality of UBM pads disposed on the bonding pads and at least a UBM island disposed on the WLP layer. The island area of the UBM island on the WLP layer is at least four times larger than the unit area of the UBM pads. A plurality of I/O pillars are one-to-one disposed on the UBM pads by plating and a plurality of supporting pillars are many-to-one disposed on the UBM island by one plating process. The unit footprint of the supporting pillars on the UBM island is smaller than the unit footprint of the I/O pillars on the UBM pads so as to compensate the height difference between the top jointing surfaces of the supporting pillars and the I/O pillars.

11 Claims, 9 Drawing Sheets

MPS-C2 SEMICONDUCTOR DEVICE HAVING SHORTER SUPPORTING POSTS

FIELD OF THE INVENTION

The present invention relates to a bumped semiconductor chip structure, and more specifically to a Metal Post Soldering Chip Connection (MPS-C2) semiconductor device having shorter supporting posts implementing in flip-chip interconnection for thinned chips with lower costs.

BACKGROUND OF THE INVENTION

Flip-chip interconnection is to fabricate bumps in an array on redistributed pads on an active surface of a chip, then the bumped chip is flipped to electrically connect to a substrate. As the advance of the flip-chip interconnection accuracy and the request of assembly cost reduction, RDL layer would no longer be fabricated on an active surface of a chip, i.e., to fabricate bumps directly on bonding pads of a chip. However, when the bump layout is not an array, the bumped chip is easily tilted during flip-chip interconnection, therefore, fabrication of extra supporting bumps at pad-free area is proposed to improve the workability and the reliability of lower-cost flip-chip interconnection.

Figure 1:
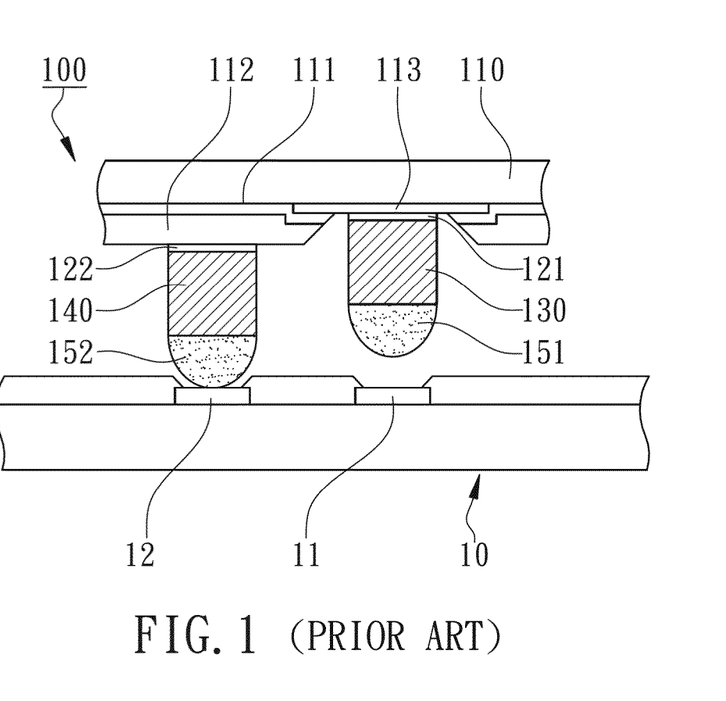
FIG. 1 is a partially cross-sectional view showing the conventional MPS-C2 semiconductor device after flip-chip interconnection.

Usually supporting bumps are directly fabricated on a thick wafer-level packaging layer such as PI layer, there is a jointing height difference between the supporting bumps and the I/O bumps. As shown in FIG. 1, a conventional MPS-C2 semiconductor device 100 is flip-chip connected to a substrate 10 where the main body of the device 100 is a thinned chip 110. A wafer-level packaging layer 112 is disposed on the active surface 111 of the chip 110 with at least one bonding pad 113 reentrant from the wafer-level packaging layer 112. UBM I/O pads 121 are disposed on the bonding pads 113 and UBM dummy pads 122 are independently disposed on the pad-free area of the wafer-level packaging layer 112. I/O pillars 130 are disposed on the UMB I/O pads 121 and supporting pillars 140 are disposed on the UMB dummy pads 122 with a same volume and a same footprint where soldering caps 151, 152 are respectively disposed on the top jointing surfaces of the I/O pillars 130 and on the top jointing surfaces of the supporting pillars 140 to physically connect to the I/O pads 11 and the fixing pads 12 on the substrate 11 through solder reflowing processes, respectively. During the same electroplating process, the heights of the I/O pillars 130 and the supporting pillars 140 are the same. However, due to the disposing jointing height difference between the UMB I/O pads 121 and the UMB dummy pads 122, there is a jointing height difference between the solder caps 151 disposed on the corresponding I/O pillars 130 and the solder caps 152 disposed on the corresponding supporting pillars 140. When the wafer-level packaging layer 112 becomes thicker, the jointing height difference of the solder caps 151 and 152 would become larger leading to a potential non-interconnection risk between the solder caps 151 on the I/O pillars 130 and the I/O pads 11 during flip-chip interconnection which causes electrical open, especially the thickness of the wafer-level packaging layer 112 is greater than 4 μm. Furthermore, the supporting pillars 140 are disposed on the wafer-level packaging layer 112 through the UMB dummy pads 122 with a smaller dimension as the same as the UMB I/O pads 121 leading to peeling, tilting, or even breaking of the supporting pillars 140.

SUMMARY OF THE INVENTION

The main purpose of the present invention is to provide a MPS-C2 semiconductor device having shorter supporting posts to compensate the jointing height difference between the supporting pillars and the I/O pillars and to prevent peeling, tilting, or even breaking of the supporting pillars and there is no need to dispose extra dummy pads for the fabrication of supporting pillars disposed between the IC circuitry and the wafer-level packaging layer.

According to the present invention, a MPS-C2 semiconductor device is revealed comprising a chip, a wafer-level packaging layer, a patterned UBM layer, a plurality of I/O pillars, and a plurality of first supporting pillars. The chip has an active surface and a plurality of bonding pads on the active surface where the wafer-level packaging layer is formed on the active surface and the bonding pads are reentrant from the wafer-level packaging layer. The patterned UBM layer includes a plurality of UMB pads and at least a first UBM island where the UBM pads are disposed on the bonding pads and the first UMB island is disposed on the wafer-level packaging layer. A first island area of the first UBM island on the WLP layer is at least four times larger than the unit area of the UBM pads. The I/O pillars are disposed on the UBM pads in a one-to-one relationship where each I/O pillar has a first top jointing surface and the first supporting pillars are disposed on the first UBM island in a many-to-one relationship by plating. Therein two or more first supporting pillars are disposed on each first UMB island and each first supporting pillar has a second top jointing surface. A second unit footprint of the first supporting pillars on the first UBM island is smaller than a first unit footprint of the I/O pillars on the UBM pads so as to compensate the jointing height difference between the second top jointing surfaces of the supporting pillars and the first top jointing surfaces of the I/O pillars.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 2:
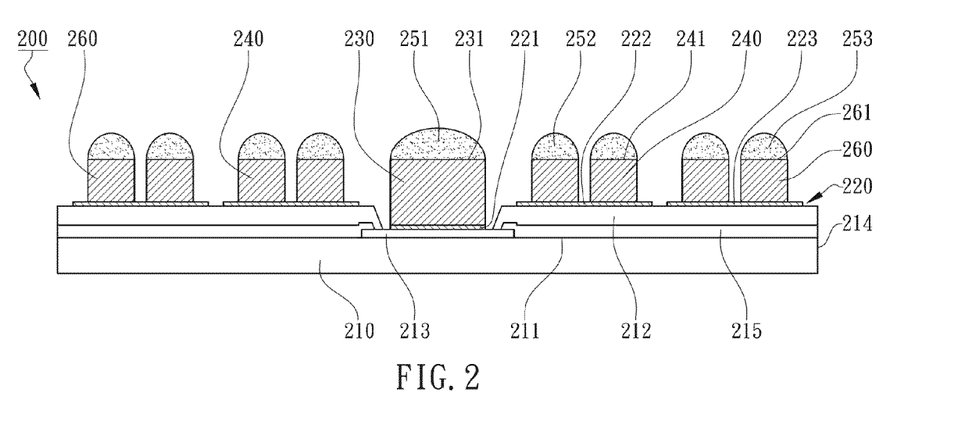
FIG. 2 is a cross-sectional view showing a MPS-C2 semiconductor device having shorter supporting posts according to the preferred embodiment of the present invention.
Figure 3:
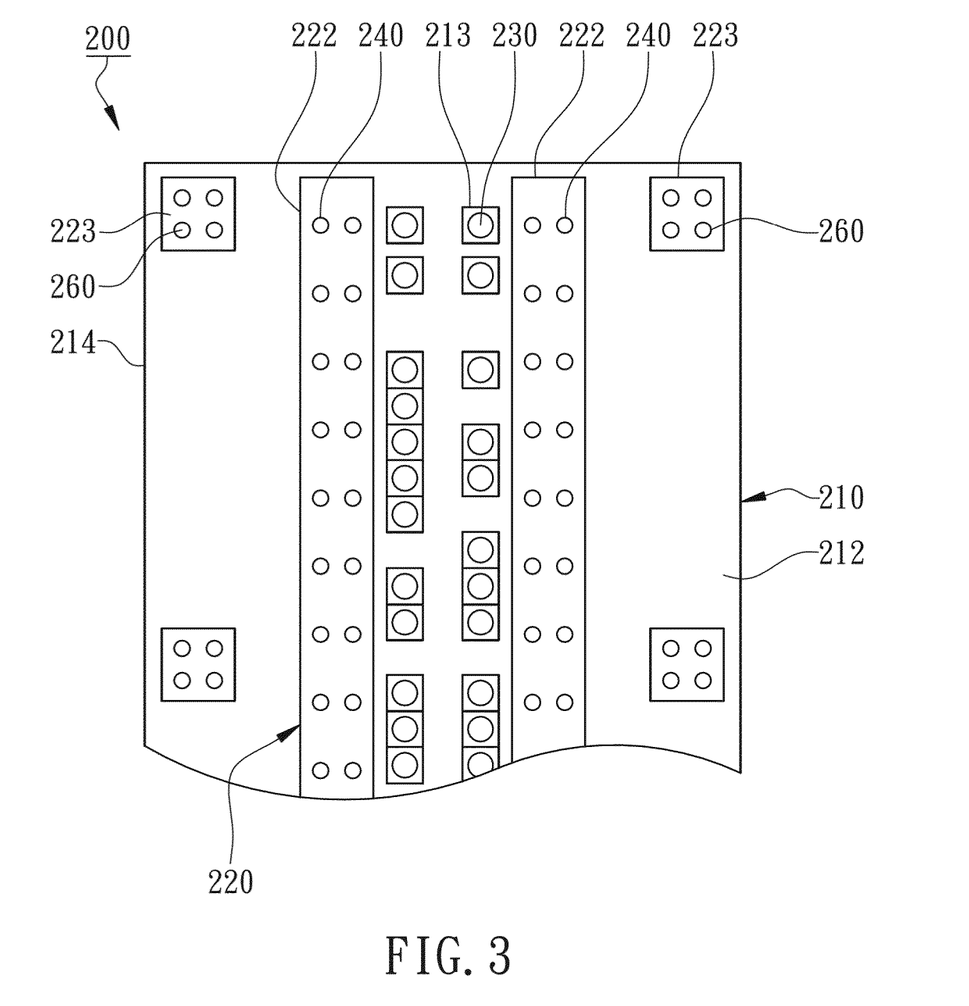
FIG. 3 is a partial top view showing the active surface of the MPS-C2 semiconductor device according to the preferred embodiment of the present invention.

According to the preferred embodiment of the present invention, a MPS-C2 semiconductor device 200 is illustrated in FIG. 2 for a cross-sectional view and in FIG. 3 for a partial top view. The MPS-C2 semiconductor device 200 is primarily comprises a chip 210, a wafer-level packaging layer 212, a patterned UBM layer 220, a plurality of I/O pillars 230, and a plurality of first supporting pillars 240.

The chip 210 has an active surface 211 and a plurality of bonding pads 213 on the active surface 211 where the chip 210 may be a processor, an ASIC, or memory with IC circuitry fabricated on the active surface 211. The wafer-level packaging layer 212 is formed on the active surface 211. The bonding pads 213 are reentrant from the wafer-level packaging layer 212 where the bonding pads 213 are electrically connected to the I/O pads of the IC circuitry or power/ground pads of the chip 210. The material of the wafer-level packaging layer 212 can be organic insulating materials such as PI or BCB to be stress buffer between the chip 210 and the I/O pillars 230. A passivation layer 215 made of glass or silicon dioxide is normally disposed on the active surface 211 of the chip 210 where the wafer-level packaging layer 212 is disposed on top of and is much thicker than the passivation layer 215. In the present embodiment, the thickness of the wafer-level packaging layer 212 ranges from 5 μm to 6 μm (micrometer).

The patterned UBM layer 220 is conductive and includes a plurality of UBM pads 221 and at least a first UBM island 222. The patterned UBM layer 220 has the following functions. The patterned UBM layer 220 can serve as a plating seed layer before patterning of the metal posts during bumping processes. After patterning processes, the patterned UBM layer 220 can serve as a diffusion barrier and an adhesion layer. Normally, the patterned UBM layer 220 is composed by several metal layers which can be the combination of TiW/Cu, Ti/Cu, or Ti/NiV/Cu. The UBM pads 221 are respectively disposed on the bonding pads 213. The first UBM island 222 is disposed on the wafer-level packaging layer 212. A first island area of the first UBM island 222 on the wafer-level packaging layer 212 is at least four times larger than the unit area of the UBM pads 221 disposed on the corresponding bonding pads 213 to increase the adhesion of the first UBM island 222 on the wafer-level packaging layer 212. The unit area of the UBM pads 221 is average of areas of the UBM pads 221. For example, the first island area of the first UBM island ranges from 1200 μm² to 20 mm² and the unit area of the UBM pads 221 ranges from 300 μm² to 6000 μm².

The I/O pillars 230 are disposed on the UBM pads 221 in a one-to-one relationship by plating, i.e., each I/O pillar 230 is corresponding to only one UBM pad 221 disposed on the bonding pad 213. The unit area of the UBM pads 221 is the same as the first unit footprint of the I/O pillars 230. Each I/O pillar 230 has a first top jointing surface 231. In the present embodiment, each I/O pillar 230 is a copper pillar with a large dimension which can be a cylinder. Since the I/O pillars 230 mainly provide the I/O interconnection points for the chip 210, it is also called an active bump which is smaller than the exposure area of the bonding pad 213 exposed from the openings of the wafer-level packaging layer 212.

The first supporting pillars 240 are disposed on the first UBM island 222 in a many-to-one relationship, wherein there are two or more first supporting pillars 240 disposed on one single UBM island 222. To be more specific, the total footprint of the first supporting pillars 240 is not more than 50% of the first island area of the first UBM island 222. Each first supporting pillar 240 has a second top jointing surface 241. In the present embodiment, each first supporting pillar 240 is a smaller copper pillar than each I/O pillar 230. The first supporting pillars 240 on each first UBM island 222 are disposed in an array. The first supporting pillars 240 are to keep a uniform gap between the chip 210 and the substrate after flip-chip interconnection to avoid tilting of the chip 210.

Moreover, the second unit footprint of the first supporting pillars 240 disposed on the first UBM island 222 is smaller than the first unit footprint of the I/O pillars 230 disposed on the UBM pads 221 to compensate the jointing height difference between the second top jointing surfaces 241 and the corresponding first top jointing surfaces 231. For example, the copper pillar length/width dimension of the first supporting pillars 240 ranges from 15 μm to 18 μm and the copper pillar length/width dimension of the I/O pillars 230 ranges from 30 μm to 100 μm. In a better structure, the unit volume ratio of the first supporting pillars 240 to the I/O pillars 230 ranges from 25% to 95% so that the second unit footprint of the first supporting pillars 240 is also smaller than the first unit footprint of the I/O pillars 230. Through the volume and dimension adjustment, the unit height and unit weight of the first supporting pillars 240 are smaller than the ones of the I/O pillars 230, which can be customer-made to enhance multiple supporting functions without hindering underfilling processes after flip-chip interconnection. The total footprint of the first supporting pillars 240 on the first UBM island 222 is preferably smaller than one-half of the first island area of the first UBM island 222. In other words, more than half of the first island area of the first UBM island 222 will not be covered by the first supporting pillars 240 so that first UBM island 222 can have a larger adhesion area to the wafer-level packaging layer 212 to enhance the adhesion of the first UBM island 222.

During the same plating processes, when the second unit footprint of the first supporting pillars 240 on the first UBM island 222 is smaller, the distributed plating current density for forming the first supporting pillars 240 is also smaller, therefore, the unit height of the second top jointing surfaces 241 of the first supporting pillars 240 will become lower. Moreover, in a product structure, the first UBM island 222 has a specific pattern on the wafer-level packaging layer 212 to provide a larger area for installing two or more first supporting pillars 240 to prevent the tilting, peeling, or displacement of the first supporting pillars 240. Preferably, the jointing height difference between the second top jointing surfaces 241 and the first top jointing surfaces 231 can be compensate to be smaller than half of the thickness of the wafer-level packaging layer 212 to achieve co-planarity of flip-chip interconnection or co-planarity of multiple chip stacking. To be more specific, the jointing height difference between the second top jointing surfaces 241 and the first top jointing surfaces 231 can be reduced and controlled under 2 μm.

Furthermore, the MPS-C2 semiconductor device 200 further comprises a plurality of first solder caps 251 disposed on the first top jointing surfaces 231 and a plurality of second solder caps 252 disposed on the second top jointing surfaces 241 so that the first supporting pillars 240 can be additional soldering terminals of the chip 210 as mechanical connection by metal posts as the I/O pillars 230. The first solder caps 251 and the second solder caps 252 are lead-free solder.

Moreover, the patterned UBM layer 220 further comprises a second UBM island 223 disposed on the wafer-level packaging layer 212 farer away from the bonding pads 213 than the first UBM island 222 where a second island area of the second UBM island 223 is also at least four times larger than the unit area of the UBM pads 221. The MPS-C2 semiconductor device 200 further comprises a plurality of second supporting pillars 260 disposed on the second UBM island 223 in a many-to-one relationship by plating. Two or more second supporting pillars 260 have disposed on each second UBM island 223 where each second supporting pillar 260 has a third top jointing surface 261. A third unit footprint of the second supporting pillars 260 disposed on the second UBM island 223 is also smaller than the first unit footprint of the I/O pillars 230 disposed on the UBM pads 221 to compensate the jointing height difference between the third top jointing surfaces 261 and the first top jointing surfaces 231, therefore, difference types of metal pillars can be designed and disposed on the UBM island 223. Normally the length and the unit footprint of the second supporting pillars 260 is the same as the length and the unit footprint of the first supporting pillars 240. Preferably, the first UBM island 222 and the second UBM island 223 may not extend to all of a plurality of sidewall 214 of the chip 210 perpendicular to the active surface 211 to avoid ESD damage during singulation processes or chip transportation. In the present embodiment, the first UBM island 222 can be disposed adjacent to the bonding pad 213 and the second UBM island 223 can be disposed on a side or a corner of the active surface 211. The shape of the first UBM island 222 can be a strip and the shape of the second UBM island 223 can be a rectangle or a square.

Therefore, the MPS-C2 semiconductor device 200 revealed in the present invention can compensate the jointing height difference between the I/O pillars and the supporting pillars to prevent peeling or tilting or even breaking of the supporting pillars. Moreover, there is no need for extra pads disposed between IC circuitry and the wafer-level packaging layer 212.

The fabrication processes of the MPS-C2 semiconductor device 200 are illustrated from FIGS. 4A to 4F.

Figure 4A:
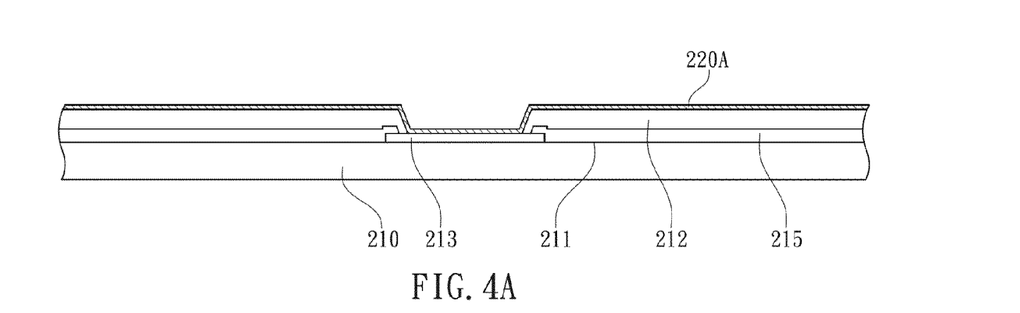
FIGS. 4A to 4G are partial component cross-sectional view showing each fabrication process of the MPS-C2 semiconductor device according to the preferred embodiment of the present invention.

As shown in FIG. 4A, chips 210 in wafer form is provided where each chip 210 has an active surface 211 where the periphery of the chip 210 can physically connect to other chips 210. A wafer-level packaging layer 212 is formed on the active surface 211. The bonding pads 213 are reentrant from the wafer-level packaging layer 212. Moreover, a UBM layer 220A covers the wafer-level packaging layer 212 and the bonding pads 213 by PVD or CVD disposition processes to serve as a plating seed layer before electrical plating processes.

Figure 4B:
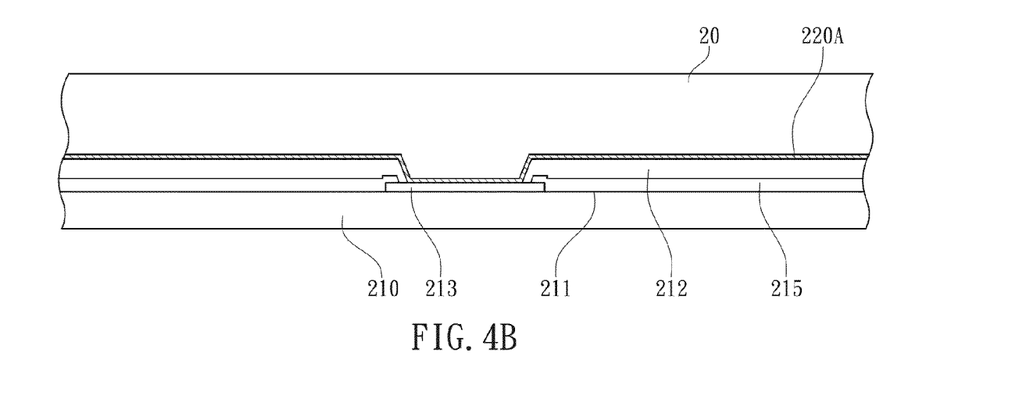
Figure 4C:
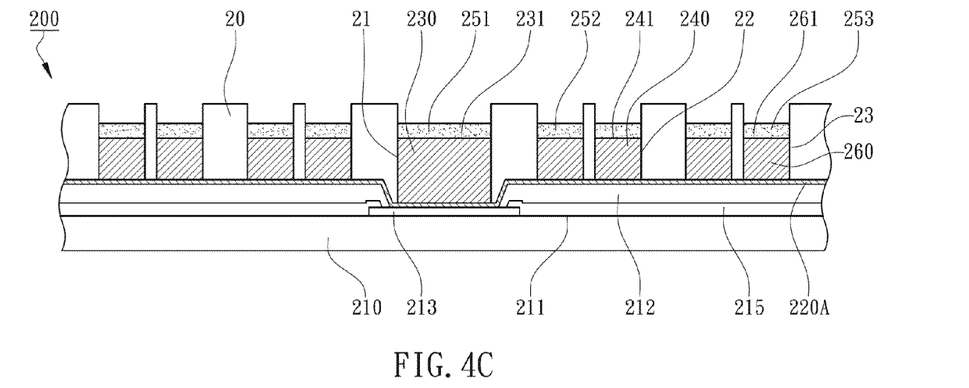

Then, as shown in FIG. 4B, a photoresist 20 is disposed on the UBM layer 220A. In the present embodiment, the photoresist 20 can be a positive resist to achieve one photoresist coating with two consecutive exposure and development processes. Alternatively, the photoresist 20 can be a negative resist with two photoresist coating with two exposure and development processes. Then, as shown in FIG. 4C, after the first exposure and development processes, the photoresist 20 has a plurality of first openings 21 aligned to the bonding pads 213 and a plurality of second openings 22 to form the pre-described first supporting pillars 240. The diameter of the first openings 21 is larger than one of the second openings. In the present embodiment, the photoresist 20 further has a plurality of third opening 23 to form the pre-described second supporting pillars 260. A plurality of I/O pillars 230 are fabricated in the first openings 21 and a plurality of the first supporting pillars 240 are fabricated in the second openings 22 by plating at the same time by using the photoresist 20 as a mask where the UBM layer 220A serves as the plating seed layer. Preferably, a plurality of the third supporting pillars 260 are also fabricated in the third openings 23 by plating at the same time. Since the opening diameter of the second openings 22 and the third openings 23 is smaller than the opening diameter of the first openings 21, therefore, the unit height of the first supporting pillars 240 and the second supporting pillars 260 is smaller than the unit height of the I/O pillars 230. Moreover, the first solder caps 251, the second solder caps 252, and the third solder caps 253 can be disposed on the I/O pillars 230, the first supporting pillars 240, and the second supporting pillars 260 by plating using the same photoresist 20.

Figure 4D:
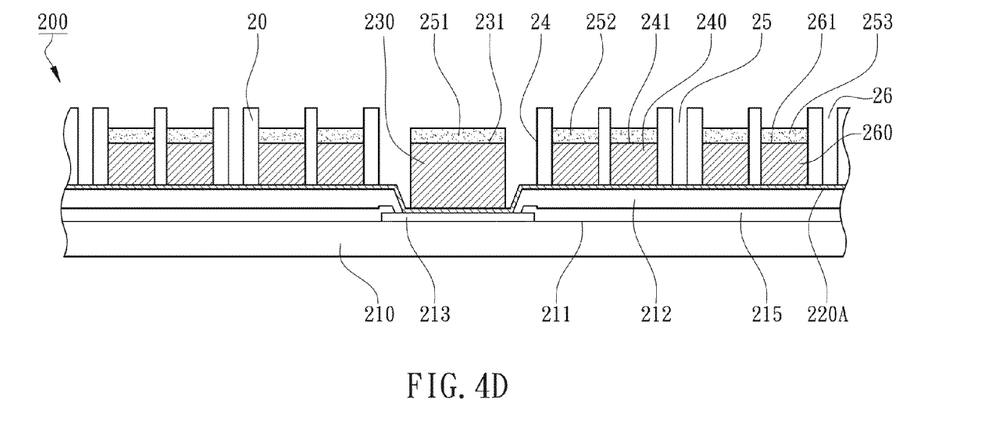
Figure 4E:
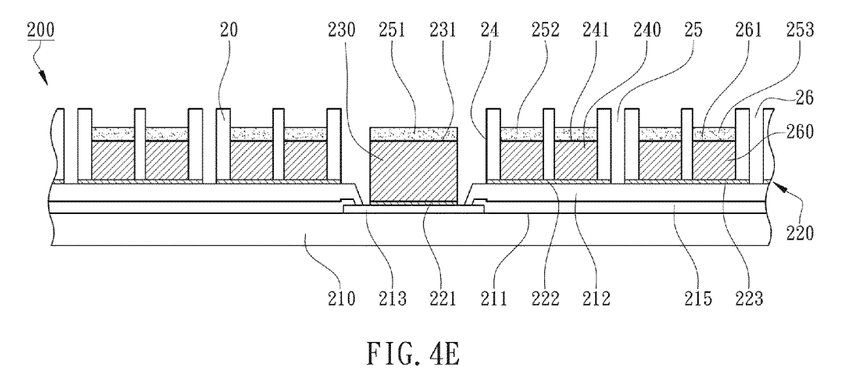
Figure 4F:
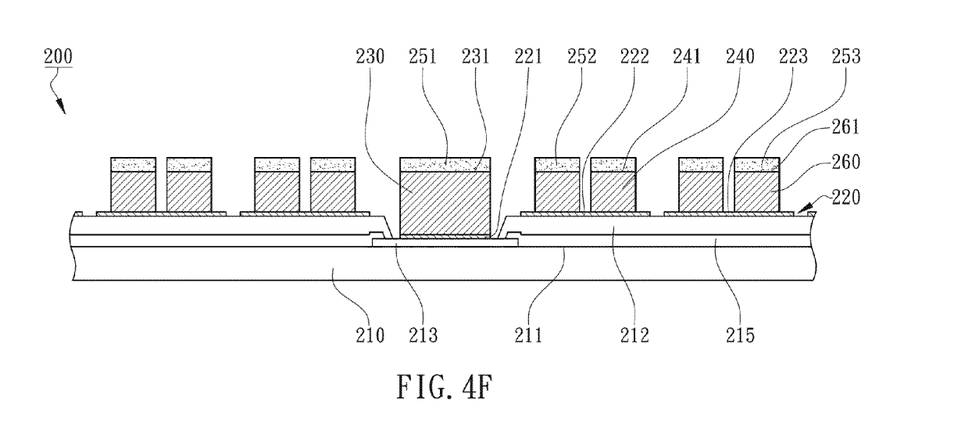
Figure 4G:
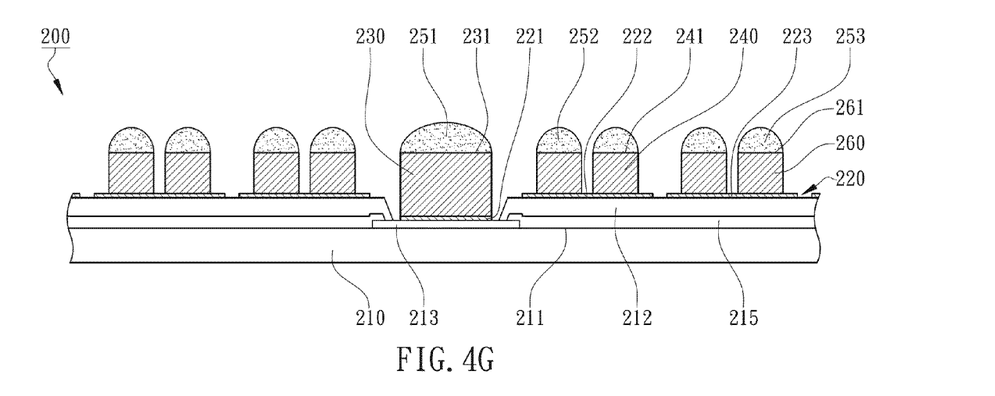

Then, as shown in FIG. 4D, the second exposure and development process is proceeded for patterning the UBM layer 220A where a plurality of extra first opening expansions 24 and a plurality of extra patterned slots 25, 26 are formed in the photoresist 20 to expose the undesired area of the UBM layer 220A whereas the first opening expansions 24 expose the undesired area of the UBM layer 220A around the I/O pillars 240. The slots 25 expose the undesired area of the UBM layer 220A between the first supporting pillars 240 and the second supporting pillars 260 where the width of the slots 25 is smaller than the gaps between one of the first supporting pillars 240 and the most adjacent one of the second supporting pillars 260. The slots 26 expose the undesired area of the UBM layer 220A around the second supporting pillars 260. As shown in FIG. 4E, the undesired area of the UBM layer 220A is etched to form a plurality of UBM pads 221 under the I/O pillars 230, a first UBM island 222 connected to the first supporting pillars 240, and a second UBM island 223 connected to the second supporting pillars 260 so that a patterned UBM layer 220 is formed from the etching of the UBM layer 220A. Whereas, the first island area of the first UBM island 222 on the wafer-level packaging layer 212 is at least four times greater than the unit area of the UBM pads 221 disposed on the bonding pads 213. The first UBM islands 222 and the second UBM island 223 are disposed on the wafer-level packaging layer 212. Then, as shown in FIG. 4F, the photoresist 20 is stripped. Then, as shown in FIG. 4G the first solder caps 251, the second solder caps 252, and the third solder caps 253 are reflowed and firmly disposed on the top jointing surfaces 231, 241, and 261 of the I/O pillars 230, the first supporting pillars 240, and the second supporting pillars 260, respectively. Finally, singulation processes are proceeded to form individual MPS-C2 semiconductor device 200. The pre-described processes of one photoresist coating with two exposure and development will reduce the amount of photoresist used and the processing steps.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A MPS-C2 semiconductor device comprising:
   a chip having an active surface and a plurality of bonding pads on the active surface;
   a wafer-level packaging layer formed on the active surface, wherein the bonding pads are reentrant from the wafer-level packaging layer;
   a patterned UBM layer including a plurality of UBM pads and at least a first UBM island, wherein the UBM pads are respectively disposed on the bonding pads and the first UBM island is disposed on the wafer-level packaging layer far away from the bonding pads, wherein a first island area of the first UBM island is at least four times greater than the unit area of the UBM pads on the corresponding bonding pads;
   a plurality of I/O pillars disposed on the corresponding UBM pads in a one-to-one relationship, wherein each I/O pillar has a first top jointing surface; and
   a plurality of first supporting pillars disposed on the first UBM island in a many-to-one relationship, wherein there are two or more first supporting pillars disposed on each first UBM island, and each first supporting pillar has a second top jointing surface, wherein a second unit footprint of the first supporting pillars on the first UBM island is smaller than a first unit footprint of the I/O pillars on the UBM pads to compensate the jointing height difference between the second top jointing surfaces and the first top jointing surfaces.

2. The MPS-C2 semiconductor device as claimed in claim 1, wherein the unit volume ratio of the first supporting pillars to the I/O pillars ranges from 25% to 95%.

3. The MPS-C2 semiconductor device as claimed in claim 2, wherein the jointing height difference between the second top jointing surfaces and the first top jointing surfaces is compensated to be smaller than half of the thickness of the wafer-level packaging layer.

4. The MPS-C2 semiconductor device as claimed in claim 3, wherein the jointing height difference between the second top jointing surfaces and the first top jointing surfaces is less than 2 µm.

5. THE MPS-C2 semiconductor device as claimed in claim 1, further comprising:
   a plurality of first solder caps disposed on the first top jointing surfaces; and
   a plurality of second solder caps disposed on the second top jointing surfaces.

6. The MPS-C2 semiconductor device as claimed in claim 1, wherein the patterned UBM layer further includes at least a second UBM island disposed on the wafer-level packaging layer farer away from the bonding pads than the first UBM island, wherein a second island area of the second UBM island is at least four times greater than the unit area of the UBM pads, the MPS-C2 semiconductor device further comprising a plurality of second supporting pillars disposed on the second UBM island in a many-to-one relationship, wherein two or more second supporting pillars are disposed on each second UBM island, and each second supporting pillar has a third top jointing surface, wherein a third unit footprint of the second supporting pillars on the second UBM island is smaller than the first unit footprint of the I/O pillars on the UBM pads to compensate the jointing height difference between the third top jointing surfaces and the first top jointing surfaces.

7. The MPS-C2 semiconductor device as claimed in claim 6, wherein the second UBM island is disposed at a side or a corner of the active surface.

8. The MPS-C2 semiconductor device as claimed in claim 7, wherein the shape of the first UBM island is a strip and the shape of the second UBM island is a rectangle or a square.

9. The MPS-C2 semiconductor device as claimed in claim 6, wherein the first UBM island and the second UBM island do not extend to all of sidewalls of the chip perpendicular to the active surface.

10. The MPS-C2 semiconductor device as claimed in claim 1, wherein the total footprint area of the first supporting pillars on the first UBM island is smaller than one-half of the first island area of the first UBM island.

11. The MPS-C2 semiconductor device as claimed in claim 1, wherein the first supporting pillars on each first UBM island are disposed in an array.

* * * * *